(12) United States Patent
Codama et al.

(10) Patent No.: US 6,307,317 B1
(45) Date of Patent: Oct. 23, 2001

(54) ORGANIC ELECTROLUMINESCENT DISPLAY AND METHOD FOR ITS MANUFACTURE

(75) Inventors: Mitsufumi Codama; Munehiro Takaku, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/311,270

(22) Filed: May 14, 1999

(30) Foreign Application Priority Data

May 15, 1998 (JP) .................................................. 10-152060

(51) Int. Cl.$^7$ ...................................................... H01J 1/62
(52) U.S. Cl. .............................................. 313/504; 445/24
(58) Field of Search .................................. 313/503, 504, 313/512, 351; 445/24

(56) References Cited

U.S. PATENT DOCUMENTS

| | | | |
|---|---|---|---|
| 5,672,938 | * | 9/1997 | Jones ..................................... 313/504 |
| 6,016,033 | * | 1/2000 | Jones et al. ........................... 313/503 |

FOREIGN PATENT DOCUMENTS 3-274694  12/1991  (JP) .

* cited by examiner

Primary Examiner—Nimeshkumar D. Patel
Assistant Examiner—Todd Reed Hopper
(74) Attorney, Agent, or Firm—Oblon, Spivak, McClelland, Maier & Neustadt, P.C.

(57) ABSTRACT

An organic EL display wherein electric connection between the electron injecting electrode layer and the electrode layer is improved, which is less likely to suffer from poor connection, and which exhibits low connection resistance is realized. A method for producing such an organic EL display is also realized. Such an organic EL display has an electrode structure which connects at least a terminal and an electron injecting electrode, and the electrode structure comprises an underlying layer 2 as a lower layer comprising a metal having low susceptibility to surface oxide layer formation, and an electrode layer 3 as an upper layer comprising a metal which has a susceptibility to surface oxide layer formation higher than that of the underlying layer 2. The underlying layer 2 and the electron injecting electrode layer 4 are in direct contact with each other at least in some parts in the region where the electrode layer 3 is connected to said electron injecting layer 4.

11 Claims, 3 Drawing Sheets

2:UNDERLYING LAYER
21:PROTECTIVE LAYER
3:ELECTRODE LAYER

ORGANIC ELECTROLUMINESCENT DISPLAY AND METHOD FOR ITS MANUFACTURE

BACKGROUND OF THE INVENTION

This invention relates to an electrode structure of an organic EL display which is constituted by using organic compounds, and which is used for an information display panel, an instrumental panel, or a display for animations or still images in home appliance and electrical components of motor vehicles and motor cycles.

Recently, considerable researches have been done on organic EL devices, and the organic EL devices are about to go into actual use. An organic EL device is a device which has a basic configuration including a transparent electrode (hole injecting electrode) of tin-doped indium oxide (ITO) etc., a thin layer of hole transporting material such as triphenyldiamine (TPD) etc. deposited by evaporation on the transparent electrode, a light emitting layer of a fluorescent material such as aluminum quinolinol complex (Alq3) on the hole transporting layer, and a metal electrode (electron injecting electrode) of a low work function metal such as Mg deposited on the hole transporting layer. Such organic EL devices have drawn public attention for its uses as a display in home appliance and electrical components of motor vehicles and motor cycles since the device is capable of producing a quite high luminance of several hundreds to several 10000 cm/m$^2$ by the drive voltage of about 10 V.

When a display such as a matrix type display is constituted by using such an organic EL device, wiring of the electrodes comes into question. For example, in FIG. 3 wherein a part of a matrix display is schematically illustrated, an ITO electrode layer 5 corresponding to 1 pixel is deposited on a substrate 1, and a passivation film 6 is deposited to surround the ITO electrode layer 5. An organic layer 7 including a light emitting layer and electron injecting electrode layer 4 are then deposited. Such structure continues to the left direction of FIG. 3 to constitute 1 line of matrix comprising necessary number of pixels. It should be noted that wiring on the side of the hole injecting electrode for connection of the ITO electrode layer 5 is omitted in FIG. 3.

The structure shown in the right-hand part of FIG. 3 is produced by depositing an underlying layer 2 and an electrode layer 3 on the substrate 1 in this order, and a part of the electron injecting electrode layer 4 extends onto the electrode layer 3. The electron injecting electrode layer 4 and the electrode layer 3 are electrically connected at this part. The underlying layer 2 and the electrode layer 3 are connected to terminal electrode (not shown) to the right direction of FIG. 3 to serve the role of power supply line.

When the organic EL display of such structure is produced, a hole injecting electrode structure such as the ITO layer 5 as well as the underlying layer 2 and the electrode layer 3 are first deposited, and the passivation layer 6 and the organic layer 7, and then, the electron injecting electrode layer 4 are deposited.

FIG. 4 is a schematic cross-sectional view of the contacting part (structure shown in the right-hand part of FIG. 3) constituted by the underlying layer 2, the electrode layer 3, and the electron injecting electrode layer 4. As shown in FIG. 4, the electron injecting electrode layer 4 is deposited on the underlying layer 2 and the electrode layer 3 which have been deposited beforehand for contact of the underlying layer 2 and the electrode layer 3 with the electron injecting electrode layer 4. An oxide layer 3a, however, is occasionally formed by oxidation of the surface of the electrode layer 3 during the formation of the passivation layer 6 and the like as shown in FIG. 4. As a consequence, when the electron injecting electrode layer 4 is deposited after the deposition of the organic layer 7, contact between the electrode layer 3 and the electron injecting electrode layer 4 may become insufficient due to the high resistance of the surface portion of the electrode layer 3, and such insufficient contact results in faulty connection and failure in the full drive of the pixels.

SUMMARY OF THE INVENTION

In view of such situation, an object of the present invention is to provide an organic EL display wherein electric connection between the electron injecting electrode layer and the electrode layer is improved, which is less likely to suffer from poor connection, and which exhibits low connection resistance. Another object is to realize a method for producing such an organic EL display.

This and other objects are achieved by the present invention which is defined below.

(1) An organic EL display having an electrode structure which connects at least a terminal and an electron injecting electrode, wherein said electrode structure comprises an underlying layer as a lower layer comprising a metal having low susceptibility to surface oxide layer formation, and an electrode layer as an upper layer comprising a metal which has a susceptibility to surface oxide layer formation higher than that of the underlying layer; and wherein said underlying layer and said electron injecting electrode layer are in direct contact with each other at least in some parts in the region where the electrode layer is connected to said electron injecting layer.

(2) An organic EL display according to the above (1) wherein the metal constituting said electrode layer has a resistivity lower than the metal constituting the underlying layer.

(3) An organic EL display according to the above (1) wherein the electron injecting electrode layer which is connected to an organic EL structure involved in light emitting function extends onto the region where said electrode layer is in contact with the electron injecting electrode layer; and the electron injecting electrode layer is electrically connected to the underlying layer in some parts thereof.

(4) An organic EL display according to the above (1) wherein a protective layer is formed on said electrode layer and said protective layer comprises a metal having a susceptibility to surface oxide layer formation lower than that of the electrode layer; and said electron injecting electrode layer is formed on said protective layer so that the electrode layer and the underlying layer are electrically connected to the electron injecting electrode layer through the protective layer.

(5) An organic EL display according to the above (1) wherein said underlying layer comprises a material selected from titanium nitride and chromium.

(6) An organic EL display according to the above (1) wherein said electrode layer comprises a material selected from aluminum or an alloy containing aluminum as its main component.

(7) An organic EL display according to the above (4) wherein said protective layer comprises the material constituting said underlying layer.

(8) An organic EL display according to the above (1) wherein at least a part of the region where said electrode layer is in contact with said electron injecting layer is formed in the shape of a comb.

(9) An organic EL display according to the above (1) wherein said display has an organic EL structure, and the organic EL structure comprises the electron injecting electrode layer, a hole injecting electrode layer, and at least one organic layer involved in the light emitting function disposed between the electron injecting electrode layer and the hole injecting electrode layer.

(10) A method for producing an organic EL display wherein an underlying layer and an electrode layer are formed in this order for connection with the terminal electrode, and the electrode layer is formed on the underlying layer to leave a portion of the underlying layer uncovered, and wherein an electron injecting electrode layer is deposited on the resulting region where the electrode layer has been formed and the underlying layer is partly left uncovered.

(11) A method for producing an organic EL display according to the above (10) wherein a part of said electrode layer is formed in the shape of a comb to thereby leave said underlying layer partly uncovered.

PREFERRED EMBODIMENT OF THE INVENTION

Figure 1:
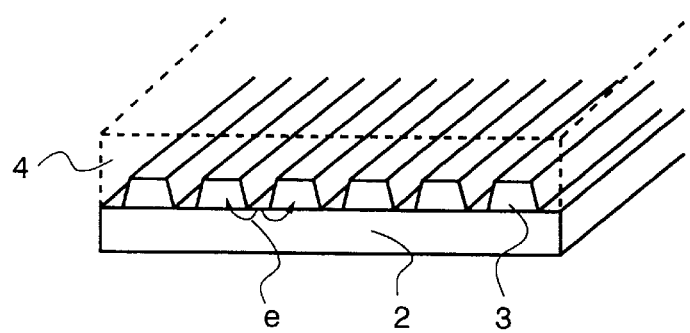
FIG. 1 is a schematic view showing the underlying layer, the electrode layer, and the electron injecting electrode layer formed thereon according to the electrode structure of the present invention.
Figure 2:
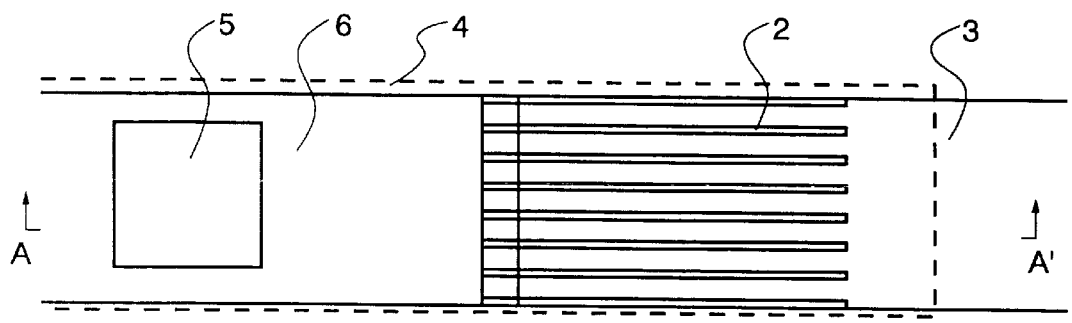
FIG. 2 is a schematic plan view showing a part of the display having the organic EL structure of the present invention.

As typically shown in FIGS. 1 and 2, the organic EL display of the present invention has an electrode structure which connects at least a terminal and an electron injecting electrode, and this electrode structure comprises an underlying layer 2 as a lower layer and an electrode layer 3 as an upper layer. The underlying layer 2 comprises a metal which has low susceptibility to surface oxide layer formation, and the electrode layer 3 comprises a metal which has a susceptibility to surface oxide layer formation higher than that of the underlying layer 2. The underlying layer 2 is left uncovered and exposed at least in some parts in the region where the electrode layer 3 is connected to said electron injecting layer 4. Preferably, the underlying layer 2 is left exposed by patterning the electrode layer 3 in comb shape.

As described above, a portion of the electrode layer 3 is formed such that the underlying layer 2 is partly left uncovered, and electric connection with the overlying electron injecting electrode layer 4 is thereby improved. In other words, the electron injecting layer 4 is in contact with both of the electrode layer 3 and the underlying layer 2, and even if an oxide layer were formed on the surface of the electrode layer 3, electric connection is still secured between the electron injecting layer 4 and the underlying layer 2 which is more resistant to surface oxidation, i.e. to the formation of the surface oxide layer resulting in the increase of the resistance.

The electron e which entered the underlying layer 2 then crosses the boundary between the underlying layer 2 and the electrode layer 3 and flows mainly through the electrode layer 3 because the electrode layer 3 has a higher conductivity (i.e. lower resistance). Therefore, increase in resistance is minute. More illustratively, most of the current which has entered from the electron injecting electrode layer 4 through the exposed region into the underlying layer 2 flows into the electrode layer 3 through the contact region of the underlying layer 2 and the electrode layer 3 adjacent to the exposed region. Therefore, the distance of the current flow in the underlying layer 2 is very short, and increase of the resistance in the underlying layer 2 is negligible.

FIG. 1 is a schematic view showing the underlying layer 2, the electrode layer 3, and the electron injecting electrode layer 4 deposited thereon. In FIG. 2, on the left-hand side of the region where the electrode layer 3 are patterned in comb shape, there is formed an organic EL structure to define 1 pixel of the matrix. The organic EL structure includes a transparent electrode layer 5 of ITO or the like, a passivation layer 6, an organic layer (not shown), and the electron injecting electrode layer 4.

The underlying layer 2 should be formed from a material which has a resistance to surface oxidation sufficiently higher than that of the material constituting the electrode layer 3. In other words, the metal material of the underlying layer 2 is superior to the metal material of the electrode layer 3 in the oxidation-reduction curve (for example, in the oxidation-reduction curve developed by Ellingham and improved by Richardson and Jeffs).

Preferably, the metal material of the underlying layer 2 has a lower resistivity (a higher conductivity) compared to the metal material of the underlying layer 2. Typical resistivity of the electrode layer at 20° C. is up to 20 $\mu\Omega$·cm, and especially up to 10 $\mu\Omega$·cm. The lower limit is not critical although the resistivity is generally at least about 2.5 $\mu\Omega$·cm. It should be noted that the underlying layer may have a resistivity in excess of that of the electrode layer.

Exemplary metal materials for the electrode layer include aluminum and aluminum alloys which preferably contains up to 10 at %, more preferably up to 5 at %, and most preferably up to 2 at % in total of at least one member selected from transition metals, in particular, Sc, Nb, Zr, Hf, Nd, Ta, Cu, Si, Cr, Mo, Mn, Ni, Pd, Pt and W. Aluminum is a material which has a low resistance, and favorable effects are produced when it is used for the electrode layer.

The underlying layer preferably comprises a material which has a sufficient etching resistance against the etchant of the electrode layer. Typical materials include nitrides such as titanium nitride, molybdenum nitride, tantalum nitride, and chromium nitride; silicides such as cobalt silicide, chromium silicide, molybdenum silicide, tungsten silicide, and titanium silicide; titanium carbide; doped silicon carbide; and chromium. Among these, use of nitrides and chromium are preferable, and titanium nitride and chromium are most preferable. Titanium nitride has a high corrosion resistance, and its use for the underlying layer is quite effective. Nitriding degree of the TiN is preferably about 10 to about 55%. The silicide, the oxide or the like as described above is generally present in stoichiometric composition, but may deviate more or less therefrom and take a non-stoichiometric composition As described above, the electrode layer is preferably formed into comb shape. The size of the electrode layer formed is preferably such that the ratio of width of the electrode layer to width of the exposed underlying layer is in the range of about 2:1 to about 8:1, and especially about 4:1 to about 6:1. Although the length and the width of the electrode layer in the comb shaped region in the particular embodiment should be determined by taking the current and other specifications adopted in the display to be produced into consideration, the length is generally about 500 to about 2000 μm, and the width is generally about 20 to about 1000 μm.

The underlying layer 2 and the electrode layer 3 may have any thickness as long as a sufficient capacity is reserved for the electric current to the electron injecting electrode layer 4. A too thin layer would cause an increase of resistance while a too thick layer is likely to result in breakage due to the stress applied or the underlying step. The underlying layer 2 may generally have a thickness of about 5 to about 100 nm, and the electrode layer 3 may generally have a thickness of about 100 to about 1000 nm.

The underlying layer and the electrode layer of the electrode structure as described above may be formed by vacuum evaporation, sputtering, or the like. In such a case, the comb shaped region may be formed by using a mask in the course of the vacuum evaporation or the sputtering of the electrode layer, or alternatively, by etching the once formed electrode layer.

When the underlying layer and the electrode layer are formed by sputtering, the resulting layers are quite dense, and ingress of moisture into the layer is drastically prevented, and a higher chemical stability as well as an extended device life in comparison with the coarse films formed by the evaporation is attained.

During sputtering, the sputtering gas is preferably under a pressure of 0.2 to 2 Pa. The sputtering gas may be any of inert gases used in conventional sputtering equipment. When a TiN film is to be deposited, the layer may be formed by sputtering using TiN target or by reactive sputtering using a TiN target. In the reactive sputtering, reactive gases such as $N_2$ or $NH_2$ may be used in addition to the inert gases as mentioned above.

The sputtering may be effected by any preferable sputtering process selected from radio frequency sputtering using an RF power supply, DC sputtering, and the like. The power of the sputtering apparatus is 0.1 to 10 $W/cm^2$ on the average as measured in the target plane in DC sputtering, and 1 to 10 $W/cm^2$ in RF sputtering. The deposition rate is preferably 5 to 100 nm/min, and in particular, at least 50 nm/min in view of productivity.

When the underlying layer and the electrode layer are formed by vacuum evaporation, the conditions for the vacuum evaporation are not critical although a vacuum of $10^{-4}$ Pa or lower and a deposition rate of about 0.1 to 5 nm/sec, and in particular, at least 1 nm/sec is preferred in view of productivity. It is preferred to successively form layers in vacuum because the successive formation in vacuum can avoid adsorption of impurities on the interface between the layers, thus ensuring better performance.

The present invention is effective not only for the case wherein the oxide layer is formed on the entire surface of the electrode layer but also for the case wherein the electrode layer is partly oxidized.

In the present invention, a protective layer may be further deposited after forming the underlying layer and the electrode layer. Such protective layer should comprise a metal which has a resistance to oxidation higher than the electrode layer. Exemplary such metal materials include those described for the underlying layer. The protective layer may preferably have a thickness of about 50 to about 300 nm. The protective layer is generally formed on the underlying layer and the electrode layer in a shape identical with or shorter than these layers by the method similar to those of the underlying layer and the electrode layer.

The terminal connected to the electron injecting layer through the wiring structure as described above is generally connected to an external circuit (a driving circuit) of the organic EL display to supply driving current to the electron injecting electrode layer. The terminal is generally formed on the substrate where the substrate is left uncovered by the shield plate, and connected to the external circuit through a connector, a contact (metal), or an anisotropic electroconductive rubber, or by soldering. The terminal comprises an electroconductive material such as Al, Cu, Ni, Co, Cr, Ag, Au, etc.

The electrode structure of the present invention may be used for displays of matrix type and segment type wherein various organic EL structures are employed.

Next, structure of the organic EL structure constituting the organic EL display of the present invention is described.

Figure 3:
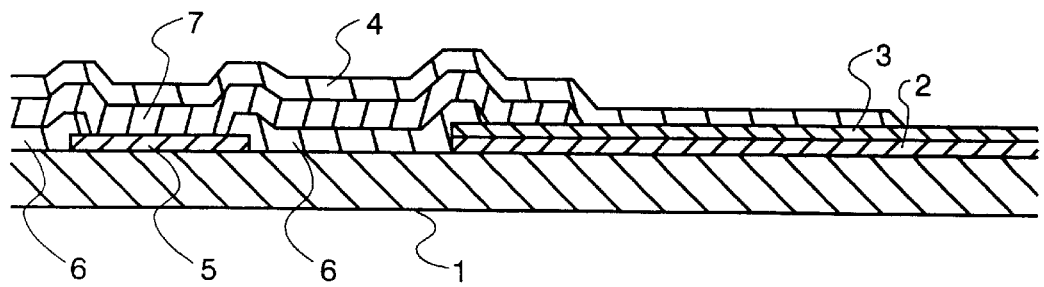
FIG. 3 is a cross sectional view of the display having the organic EL structure of the present invention.

The organic EL structure used in the organic EL display of the present invention includes a substrate 1, a hole injecting electrode 5 comprising ITO or the like, a passivation layer 6 surrounding the hole injecting electrode 5, at least one organic layer 7, and electron injecting layer 4 formed on the substrate 1 as shown in FIG. 3. FIG. 3 is a cross sectional view taken along lines A–A' in FIG. 2. In FIG. 3, wiring electrodes and the like provided for connection of the hole injecting electrode layer corresponding to one pixel are omitted. The one or more organic layers 7 respectively include at least one hole transporting layer and light emitting layer, and the electron injecting electrode is formed on the one or more organic layers 7. The organic EL structure may have a protective electrode as its uppermost layer. It should be noted that the hole transporting layer is not critical.

The hole injecting electrode is preferably a transparent or translucent electrode since the hole injecting electrode is often situated on the light exit side. Typical transparent electrodes include ITO (tin-doped indium oxide), IZO (zinc-doped indium oxide), ZnO (zinc oxide), $SnO_2$ (tin oxide), and indium oxide ($In_2O_3$), and the preferred are ITO (tin-doped indium oxide) and IZO (zinc-doped indium oxide). ITO generally contains $In_2O_3$ and SnO in stoichiometric compositions, although the oxides may deviate more or less from their stoichiometric compositions.

The hole injecting electrode may preferably have a light transmittance of at least 80%, and more preferably at least 90% in the light emission band, typically from 350 to 800 nm, and especially at each light emission. Since the light emitted by the light emitting layer exits through the hole injecting electrode, with a lower transmittance, the light emitted by the light emitting layer is attenuated through the electrode, failing to provide a luminance necessary as a light emitting device. It is noted that the electrode on the light exit side should preferably have a light transmittance of at least 80%.

The hole injecting electrode may have a thickness which facilitates sufficient hole injection. Preferably the electrode has a thickness of 10 to 500 nm, and especially 30 to 300 nm. Although the upper limit of the electrode thickness is not critical, a too thick electrode would cause separation, poor workability, reduced resistance to stress, drop of transmittance, leakage due to surface roughness. Too thin an electrode is insufficient in film strength during fabrication, hole transporting capacity and resistivity. It should be noted that the hole injecting electrode is generally connected to a different terminal by the electrode structure different from the above-described structure.

The hole injecting electrode layer is preferably formed by sputtering although the layer may be formed by vacuum evaporation or the like.

The electron injecting electrode layer may comprise a material of low work function such as a simple metal element, for example, K, Li, Na, Mg, La, Ce, Ca, Sr, Ba, Al, Ag, In, Sn, Zn, or Zr, or a binary or ternary alloy containing such metal element for stability improvement. Exemplary alloys are Ag—Mg (Ag: 0.1 to 50 at %), Al—Li (Li: 0.01 to 12 at %), In—Mg (Mg: 50 to 80 at %), and Al—Ca (Ca: 0.01 to 20 at %). The electron injecting electrode layer may be formed by vacuum evaporation or sputtering.

Such electron injecting electrode layer may have at least a sufficient thickness to effect electron injection, for example, a thickness of at least 0.5 nm, and preferably at least 1 nm. Although the upper limit is not critical, the electrode thickness is typically about 1 to about 500 nm. On the electron injecting electrode layer, a protective electrode may be provided, if desired.

The protective electrode may have at least a sufficient thickness to ensure efficient electron injection and prevent the ingress of moisture, oxygen and organic solvents, for example, a thickness of at least 50 nm, preferably at least 100 nm, more preferably 100 to 1000 nm. A too thin protective electrode layer would exert its effect little, lose a step coverage capability, and provide insufficient connection to a terminal electrode. If too thick, greater stresses are generated in the auxiliary electrode layer, accelerating the growth rate of dark spots.

The thickness of the electron injecting electrode and the protective electrode combined is usually about 100 to about 1000 nm though it is not critical.

After the electrode deposition, a protective layer may be formed in addition to the protective electrode as described above. The protective layer may be formed from by using an inorganic material such as SiOx, an organic material such as Teflon or chlorine-containing fluorocarbon polymer, or the like. The protective layer may be either transparent or non-transparent, and the thickness is about 50 to about 1200 nm. The protective layer may be formed by reactive sputtering as described above, or by common sputtering, vacuum evaporation, PECVD, or the like.

Further preferably, a shield plate may be provided on the display in order to prevent the organic layers and electrodes of the display from oxidation. In order to prevent the ingress of moisture, the shield plate is attached to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical.

The shield plate is selected from plates of transparent or translucent materials such as glass, quartz and resins, with glass being especially preferred. Alkali glass is preferred because of economy although other glass compositions such as soda lime glass, lead alkali glass, borosilicate glass, aluminosilicate glass, and silica glass are also useful. Of these, plates of soda glass without surface treatment are inexpensive and useful. Beside the glass plates, metal plates and plastic plates may also be used as the shield plate.

Using a spacer for height adjustment, the shield plate may be held at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m. The lower limit of length is not critical although it is usually equal to or more than the diameter.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30 wt %, and more preferably 0.1 to 5 wt %.

Any of adhesives which can maintain stable bond strength and gas tightness may be used although UV curable epoxy resin adhesives of cation curing type are preferred.

The substrate used herein is not critical, and may be adequately selected according to the material used for the electrode of the organic EL structure of the invention. Exemplary materials include metal materials such as aluminum, as well as transparent and translucent materials such as glass, quartz, and resins. The substrate may typically comprise a ceramics such as alumina, a metal sheet such as a stainless steel sheet which has been subjected to an insulating treatment such as surface oxidization, a thermosetting resin such as phenol resin, or a thermoplastic resin such as polycarbonate.

Next, the organic layers formed in the organic EL structure of the invention are described.

The light emitting layer has the function of injecting the holes (positive holes) and the electrons, the function of transporting such holes and electrons, and the function of producing exciter by recombination of the holes and the electrons. By using a relatively neutral compound for the light emitting layer, the electrons and the holes can be readily injected and transported at a good balance.

The hole injecting and transporting layer has the functions of facilitating injection of holes from the hole injecting electrode, transporting holes stably, and obstructing electrons. The electron injecting and transporting layer has the functions of facilitating injection of electrons from the electron injecting electrode, transporting electrons stably, and obstructing holes. These layers are effective for increasing the number of holes and electrons injected into the light emitting layer and confining holes and electrons therein for optimizing the recombination region to improve luminous efficiency.

The thickness of the light emitting layer, the hole injecting and transporting layer, and the electron injecting and transporting layer is not critical, and may vary depending on the particular process used for their formation. The thickness, however, is generally about 5 to 500 nm, and in particular, 10 to 300 nm.

The thickness of the hole injecting and transporting layer and the electron injecting and transporting layer may be equivalent with or about 1/10 to about 10 folds of the thickness of the light emitting layer although the thickness depends on the particular design of the recombination/light emitting region. When the injecting layer and the transporting layer of the electrons/holes are separately provided, the injecting layer and the transporting layer may respectively have a thickness of at least 1 nm. The upper limit for the thickness of the injecting or transporting layer is typically about 500 nm for the injecting layer and about 500 nm for the transporting layer. The same applies for the thickness of the injecting and transporting layers when two such layers are provided.

The light emitting layer of the organic EL device contains a fluorescent material that is a compound having a light emitting function. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

It is preferred to use such a compound in combination with a host material capable of light emission by itself, that is, to use the compound as a dopant. In this embodiment, the content of the compound in the light emitting layer is preferably 0.01 to 20% by weight, especially 0.1 to 15% by weight. By using the compound in combination with the host material, the light emission wavelength of the host material can be altered, allowing light emission to be shifted to a longer wavelength and improving the luminous efficiency and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato) aluminum, bis(8-quinolinolato)magnesium, bis(benzo{f}-8-quinolinolato)zinc, bis(2-methyl-8-quinolinolato)aluminum oxide, tris(8-quinolinolato)indium, tris(lato)aluminum, 8-quinolinolatolithium, tris(5-chloro-8-quinolinolato) gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato) aluminum(III), bis(2-methyl-8-quinolinolato)(ortho-cresolato)aluminum(III), bis(2-methyl-8-quinolinolato) (metacresolato)aluminum(III), bis(2-methyl-8-quinolinolato)(paracresolato)aluminum(III), bis(2-methyl-8-quinolinolato)(ortho-phenylphenolato)aluminum(III), bis (2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum (III), bis(2-methyl-8-quinolinolato)(3,4-dimethylphenolato) aluminum(III), bis(2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato) aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis (2-methyl-8-quinolinolato)(2,3,5,6-tetramethylphenolato) aluminum(III), bis(2-methyl-8-quinolinolato)(1-naphtholato)aluminum(III), bis(2-methyl-8-quinolinolato) (2-naphtholato)aluminum(III), bis(2,4-dimethyl-8-quinolinolato)(orthophenylphenolato)aluminum(III), bis(2, 4-dimethyl-8-quinolinolato)(para-phenylphenolato) aluminum(III), bis(2,4-dimethyl-8-quinolinolato)(meta-phenylphenolato) aluminum(III), bis(2,4-dimethyl-8-quinolinolato)(3,5-dimethylphenolato)aluminum(III), bis(2, 4-dimethyl-8-quinolinolato)(3,5-di-tert-butylphenolato) aluminum(III), bis(2-methyl-4-ethyl-8-quinolinolato)(para-cresolato)aluminum(III), bis(2-methyl-4-methoxy-8-quinolinolato)(paraphenylphenolato)aluminum(III), bis(2-methyl-5-cyano-8-quinolinolato)(ortho-cresolato)aluminum (III), and bis(2-ethyl-6-trifluoromethyl-8-quinolinolato)(2-naphtholato)aluminum(III).

Also acceptable are bis(2-methyl-8-quinolinolato) aluminum(III)-$\mu$-oxo-bis(2-methyl-8-quinolinolato) aluminum (III), bis(2,4-dimethyl-8-quinolinolato)aluminum (III)-$\mu$-oxobis(2,4-dimethyl-8-quinolinolato)aluminum(III), bis(4-ethyl2-methyl-8-quinolinolato)aluminum(III)$\mu$-oxo-bis(4-ethyl-2-methyl-8-quinolinolato)aluminum(III), bis(2-methyl-4-methoxyquinolinolato)aluminum(III)$\mu$-oxo-bis(2-methyl-4-methoxyquinolinolato)aluminum(III), bis(5-cyano-2-methyl-8-quinolinolato)aluminum(III)$\mu$-oxo-bis (5-cyano-2-methyl-8-quinolinolato)aluminum(III), and bis (2-methyl-5-trifluoromethyl-8-quinolinolato)aluminum (III)-$\mu$-oxo-bis(2-methyl-5-trifluoromethyl-8-quinolinolato) aluminum(III).

Other useful host materials are the phenylanthracene derivatives described in JP-A 12600/1996 (Japanese Patent Application No. 110569/1994) and the tetraarylethene derivatives described in JP-A 12969/1996 (Japanese Patent Application No. 114456/1994).

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from the hole injecting and transporting compounds and the electron injecting and transporting compounds to be described later, respectively. Inter alia, the hole injecting and transporting compound is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

As the hole injecting and transporting compound, amine derivatives having intense fluorescence are useful, for example, the triphenyldiamine derivatives, styrylamine derivatives, and amine derivatives having an aromatic fused ring, exemplified above as the hole injecting and transporting material.

The mix ratio is preferably determined in accordance with the carrier density and carrier mobility of the respective compounds. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer. Specifically, the mix layer is preferably 1 to 85 nm, more preferably 5 to 60 nm, especially 5 to 50 nm thick.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

For the hole injecting and transporting layer, use may be made of various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. These compounds may be used alone or in admixture of two or more. On combined use of two or more of these compounds, they may be formed as separate stacked layers or mixed.

When the hole injecting and transporting layer is deposited as two separate hole injecting layer and hole transporting layer, the compounds for respective layers may be selected in an adequate combination from the compounds for the hole injecting and transporting layer. In such situation, the compounds may be deposited from the side of the hole injecting electrode (comprising ITO or the like) in the order of ionization potential from the smaller to the larger ionization potential, and a compound adapted for thin film formation may be used for the surface of the hole injecting electrode. The stacking order as described above also applies when two or more hole injecting and transporting layers are provided. Such stacking order enables to reduce the drive voltage, and restrain current leak as well as development and growth of dark spots. Since the layer has been formed by evaporation and the layer as thin as about 1 to about 10 nm is homogeneous and free from pin holes, when the structure is used as a device, change in color tone of the light emitted and efficiency drop by resorption can be prevented even if the hole injecting layer were formed from a compound which has small ionization potential and absorption in the visible region. The hole injecting and transporting layer can be formed by evaporation of such compound as in the case of light emitting layer and the like.

The electron injecting and transporting compound is preferably selected from quinoline derivatives such as organic complexes having 8-quinolinol or a derivative thereof as a ligand, especially tris(8-quinolinolato) aluminum (Alq3). Also preferred are oxadiazole derivatives, perylene derivatives, pyridine derivatives, pyrimidine derivatives, quinoxaline derivatives, diphenylquinone derivatives, nitro-substituted fluorene derivatives, and the like. The electron injecting and transporting layer may also serve the light emitting layer, and in such a case, use of tris(8-quinolinolato)aluminum (Alq3) or the like is preferred. The electron injecting and transporting layer can be formed by evaporation or the like as in the case of light emitting layer and the like.

When the electron injecting and transporting layer is deposited as two separate electron injecting layer and electron transporting layer, the compounds for respective layers may be selected in an adequate combination from the compounds for the electron injecting and transporting layer. In such situation, the compounds may be deposited from the side of the electron injecting electrode in the order of electron affinity from the larger to the smaller affinity. The stacking order as described above also applies when two or more electron injecting and transporting layers are provided.

In forming the hole injecting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of up to 0.1 $\mu$m. If the grain size is in excess of 0.1 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, it is preferable that the boats having the compounds received therein are individually temperature controlled to achieve co-deposition.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting external light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, those materials which are not damaged during deposition of ITO or IZO are preferable.

The light absorbing material is used when the light absorption of the fluorescent material is short and may be omitted if unnecessary. The light absorbing material may also be selected from materials which do not cause extinction of fluorescence of the fluorescent material.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of up to 0.1 $\mu$m. If the grain size is in excess of 0.1 $\mu$m, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to about 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, it is preferable that the boats having the compounds received therein are individually temperature controlled to achieve co-deposition.

The organic EL device is generally of the ac or pulse drive type, and alternatively, of the dc drive type. The applied voltage is generally about 2 to about 30 volts.

EXAMPLES

Examples of the present invention are given below by way of illustration and not by way of limitation.

Example 1

On a glass substrate, a transparent ITO electrode (hole injecting electrode) was deposited to a thickness of about 100 nm by sputtering. The resulting ITO thin film was patterned and etched by photolithography to produce a hole injecting electrode layer wherein a pattern of 64×256 dots (pixels) are defined.

Next, an underlying layer (titanium nitride) and an electrode layer (aluminum) were deposited in this order by sputtering to 50 nm and 300 nm thick, respectively, and the electrode layer was patterned by photolithography to the shape of a comb. A sample with no such patterning to the comb shape was also prepared for comparison purpose.

A passivation layer ($SiO_2$) was formed (by patterning) except for the light emitting region, and the region where the underlying layer and the electrode layer are in contact with the electron injecting layer. A device separation structure was then formed to separate each electron injecting electrode.

Figure 4:
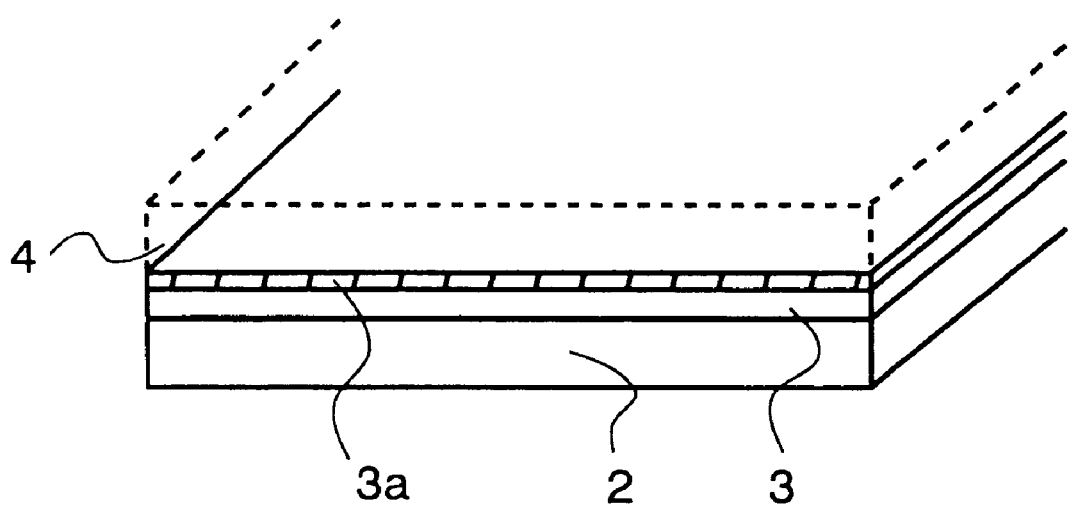
FIG. 4 is a schematic view showing the underlying layer, the electrode layer, and the electron injecting electrode layer formed thereon according to a prior art embodiment.
Figure 5:
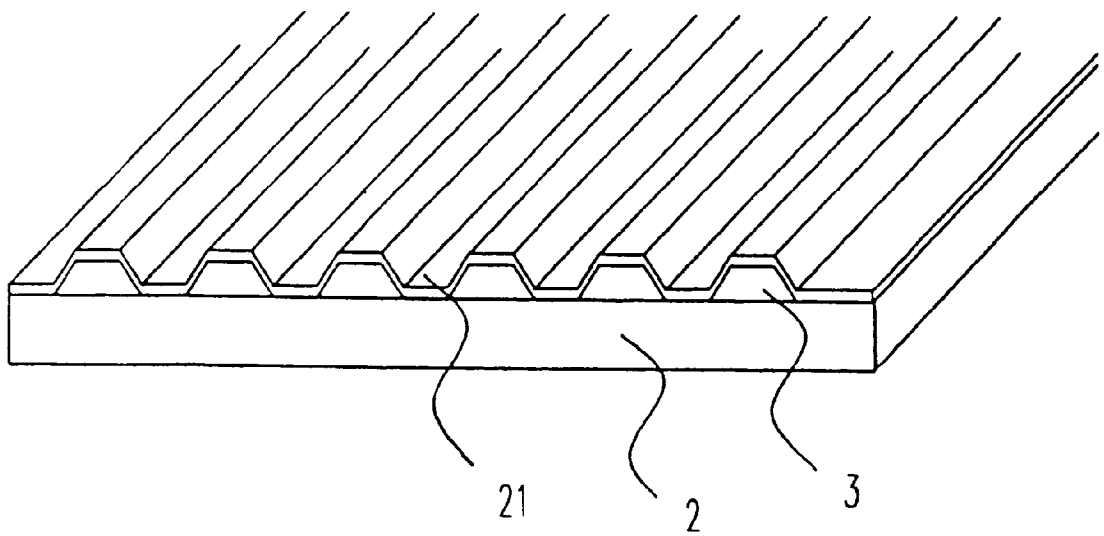
FIG. 5 is a schematic view showing the underlying layer, protective layer and the electrode layer, according to one embodiment of the present invention.

After cleaning the surface of the substrate having formed thereon the ITO electrode, the underlying layer, and the electrode layer with $UV/O_3$, a mask having an overhang structure with shield function of the organic layer as described in Japanese Patent Application No. 1997/41663 (FIGS. 4 and 5) was placed, and the substrate was secured by a holder in a sputtering chamber, which was evacuated to a vacuum of $1\times10^{-4}$ Pa or lower. 4,4',4"-tris(-N-(3-methylphenyl)-N-phenylamino)triphenylamine (hereinafter referred to as m-MTDATA) was evaporated to a thickness of 40 nm at a deposition rate of 0.2 nm/sec to form the hole injecting layer, and with the vacuum kept, N,N'-diphenyl-N,N'-m-tolyl-4,4'-diamino-1,1'-biphenyl (hereinafter referred to as TPD) was evaporated at a deposition rate of 0.2 nm/sec to a thickness of 35 nm to form the hole transporting layer. With the vacuum kept, tris(8-quinolinolato)aluminum (hereinafter referred to as Alq3) was then formed to a thickness of 50 nm at a deposition rate of 0.2 nm/sec to form the electron injecting and transporting/light emitting layer.

With the vacuum kept, the substrate of the EL device structure was then moved from the evaporation apparatus to a sputtering apparatus wherein the AlLi electron injecting electrode layer (Li concentration: 7.2 at %) was evaporated to a thickness of 50 nm at a sputtering pressure of 1.0 Pa. The sputtering was conducted with the sputtering gas of Ar, at an input power of 100 W, a target diameter of 4 inches, and the substrate target distance of 90 mm. With the vacuum kept, the EL device substrate was moved to another sputtering apparatus wherein an Al protective electrode was evaporated to a thickness of 200 nm by DC sputtering using an Al target at a sputtering pressure of 0.3 Pa. The sputtering was conducted with the sputtering gas of Ar, at input power of 500 W, a target diameter of 4 inches, and the substrate target distance of 90 mm. The mask was removed after completing the formation of all layers.

Final sealing of a glass shield completed an organic EL display having the electrode structure as shown in FIGS. 1 to 3.

The resulting EL displays were evaluated by applying DC voltage to the displays in air and continuously driving the displays at a constant current density of 10 $MA/cm^2$. The drive voltage at the same luminance was measured for each sample, and it was then confirmed that the drive voltage is reduced by about 1 V in the sample having the electrode layer with the comb shaped structure compared to the comparative sample without such comb shaped structure, revealing drop of the resistance at the connection between the electron injecting electrode layer and the electrode layer. The results were also substantially equivalent when aluminum used for the electrode layer was replaced with an alloy of aluminum with Sc, Nb, Sc, Nb, Zr, Hf, Nd, Ta, Cu, Si, Cr, Mo, Mn, Ni, Pd, Pt or W.

Example 2

An organic EL display was produced by repeating the procedure of Example 1 except that a protective layer (titanium nitride) was formed to 100 nm thick after forming the underlying layer (titanium nitride) and the electrode layer (aluminum), and patterned by photolithography.

The resulting organic EL display was evaluated as in the case of Example 1, and the results were substantially equivalent to those of Example 1.

As described above, the present invention has enabled to provide an organic EL display wherein electric connection between the electron injecting electrode layer and the electrode layer is improved, which is less likely to suffer from poor connection, and which exhibits low connection resistance. Also realized is a method for producing such an organic EL display.

Japanese Patent Application No. 152060/1998 is incorporated herein by reference.

Although some preferred embodiments have been described, many modifications and variations may be made thereto in the light of the above teachings. It is therefore to be understood that, within the scope of the appended claims, the invention may be practiced otherwise than as specifically described.

What is claimed is:

1. An organic EL display having an electrode structure which connects at least a terminal and an electron injecting electrode, wherein said electrode structure comprises
an underlying layer as a lower layer comprising a metal having low susceptibility to surface oxide layer formation, and
an electrode layer as an upper layer comprising a metal which has a susceptibility to surface oxide layer formation higher than that of the underlying layer; and wherein said underlying layer and said electron injecting electrode layer are in direct contact with each other at least in some parts in the region where the electrode layer is connected to said electron injecting layer.

2. An organic EL display according to claim 1 wherein the metal constituting said electrode layer has a resistivity lower than the metal constituting the underlying layer.

3. An organic EL display according to claim 1 wherein the electron injecting electrode layer which is connected to an organic EL structure involved in light emitting function extends onto the region where said electrode layer is in contact with the electron injecting electrode layer; and the electron injecting electrode layer is electrically connected to the underlying layer in some parts thereof.

4. An organic EL display according to claim 1 wherein a protective layer is formed on said electrode layer and said protective layer comprises a metal having a susceptibility to surface oxide layer formation lower than that of the electrode layer; and said electron injecting electrode layer is formed on said protective layer so that the electrode layer and the underlying layer are electrically connected to the electron injecting electrode layer through the protective layer.

5. An organic EL display according to claim 1 wherein said underlying layer comprises a material selected from titanium nitride and chromium.

6. An organic EL display according to claim 1 wherein said electrode layer comprises a material selected from aluminum or an alloy containing aluminum as its main component.

7. An organic EL display according to claim 4 wherein said protective layer comprises the material constituting said underlying layer.

8. An organic EL display according to claim 1 wherein at least a part of the region where said electrode layer is in contact with said electron injecting layer is formed in the shape of a comb.

9. An organic EL display according to claim 1 wherein said display has an organic EL structure, and the organic EL structure comprises the electron injecting electrode layer, a hole injecting electrode layer, and at least one organic layer involved in the light emitting function disposed between the electron injecting electrode layer and the hole injecting electrode layer.

10. A method for producing an organic EL display wherein an underlying layer and an electrode layer are formed in this order for connection with the terminal electrode, and the electrode layer is formed on the underlying layer to leave a portion of the underlying layer uncovered, and wherein an electron injecting electrode layer is deposited on the resulting region where the electrode layer has been formed and the underlying layer is partly left uncovered.

11. A method for producing an organic EL display according to claim 10 wherein a part of said electrode layer is formed in the shape of a comb to thereby leave said underlying layer partly uncovered.

* * * * *